(12) United States Patent  (10) Patent No.: US 9,142,287 B2
Ordentlich et al.  (45) Date of Patent: Sep. 22, 2015

(54) CODING FOR CROSSBAR ARCHITECTURE

(75) Inventors: Erik Ordentlich, San Jose, CA (US); Ron M. Roth, Haifa (IL)

(73) Assignee: Hewlett-Packard Development Company, L.P., Houston, TX (US)

( * ) Notice: Subject to any disclaimer, the term of this patent is extended or adjusted under 35 U.S.C. 154(b) by 228 days.

(21) Appl. No.: 13/383,644

(22) PCT Filed: Mar. 12, 2010

(86) PCT No.: PCT/US2010/027227
§ 371 (c)(1),
(2), (4) Date: Jan. 12, 2012

(87) PCT Pub. No.: WO2011/112201
PCT Pub. Date: Sep. 15, 2011

(65) Prior Publication Data
US 2012/0324140 A1  Dec. 20, 2012

(51) Int. Cl.
*G06F 13/00* (2006.01)
*G11C 13/00* (2006.01)

(52) U.S. Cl.
CPC ........ *G11C 13/0002* (2013.01); *G11C 2213/77* (2013.01)

(58) Field of Classification Search
CPC ..................... G11C 13/0002; G11C 2213/77
USPC .......................................................... 710/317
See application file for complete search history.

(56) References Cited

U.S. PATENT DOCUMENTS

| 6,175,317 | B1 | 1/2001 | Ordentlich et al. | |
|---|---|---|---|---|
| 6,570,782 | B1 * | 5/2003 | Brandenberger et al. | 365/100 |
| 8,000,161 | B2 * | 8/2011 | Stan et al. | 365/202 |
| 2006/0129340 | A1 | 6/2006 | Straznicky | |
| 2006/0168505 | A1 * | 7/2006 | Liaw et al. | 714/823 |
| 2006/0238223 | A1 | 10/2006 | Kuekes et al. | |
| 2006/0281277 | A1 * | 12/2006 | Tamai et al. | 438/385 |
| 2007/0053378 | A1 | 3/2007 | Kuekes et al. | |
| 2008/0088290 | A1 * | 4/2008 | So | 323/284 |
| 2008/0089110 | A1 | 4/2008 | Robinett | |
| 2008/0224260 | A1 * | 9/2008 | Schmit et al. | 257/530 |
| 2008/0232160 | A1 * | 9/2008 | Gopalakrishnan | 365/163 |

(Continued)

FOREIGN PATENT DOCUMENTS

CN  101540610  9/2009

OTHER PUBLICATIONS

International Searching Authority, The International Search Report and the Written Opinion, Nov. 30, 2010, 10 Pages.
Ron M. Roth et al, Efficient Coding for a Two-Dimensional Runlength-Limited Constraint, Computer Science Department, Retrieved May 12, 2015, 10 Pages.

(Continued)

*Primary Examiner* — Nimesh G Patel
(74) *Attorney, Agent, or Firm* — Van Cott, Bagley, Cornwall & McCarthy

(57) ABSTRACT

A method for encoding bits to be stored within a crossbar memory architecture performed by a physical computing system includes designating, with the physical computing system, a subset of crosspoints within a crossbar matrix, the crossbar matrix comprising a number of disjointed intersecting wire segments, the subset corresponding to a predetermined path through the crossbar matrix; and encoding, with the physical computing system, a number of data bits to be placed along the predetermined path; in which the encoding causes bits pertaining to at least one of the wire segments to be subject to a constraint when the data bits are placed along the predetermined path.

11 Claims, 8 Drawing Sheets

(56) References Cited

U.S. PATENT DOCUMENTS

2008/0237886 A1    10/2008  Wu et al.
2009/0003040 A1     1/2009  Stan
2010/0046272 A1*    2/2010  Inoue ............................ 365/148
2012/0063192 A1*    3/2012  Lee ............................... 365/148
2013/0322153 A1*   12/2013  Burr et al. ..................... 365/148

OTHER PUBLICATIONS

Zsigmond Nagy et al, Bit Stuffing Algorithms and Analysis for Run Length Constrained Channels in Two and Three Dimensions, (Research Paper), IEEE Transactions on Informaton Theory, Nov. 16, 2002, 40 Pages.

* cited by examiner

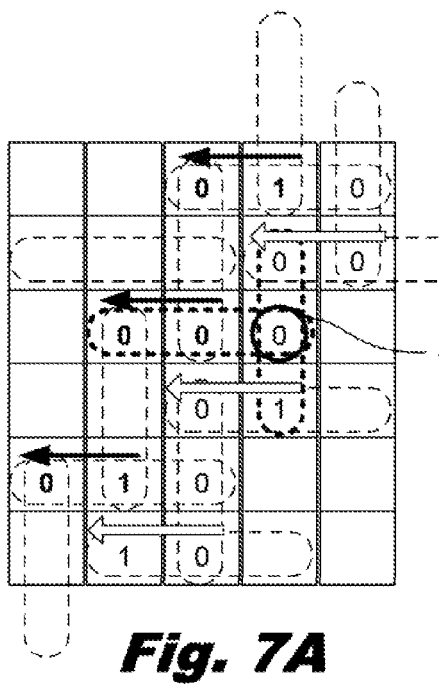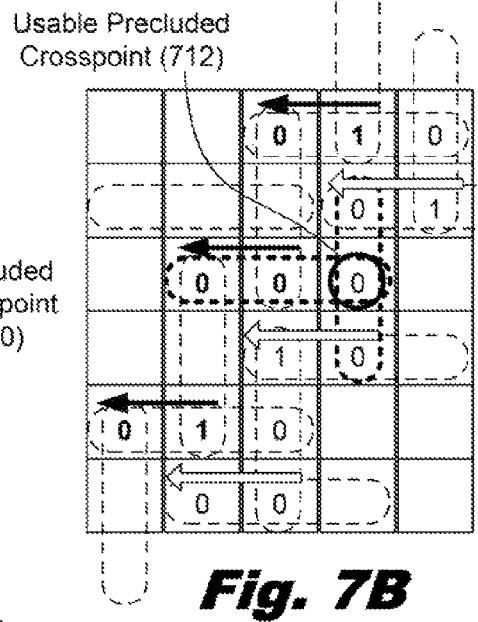
Fig. 7A
Fig. 7B
Fig. 7C

CODING FOR CROSSBAR ARCHITECTURE

STATEMENT OF GOVERNMENT INTEREST

This invention has been made with government support. The government has certain rights in the invention.

BACKGROUND

Electronic data is typically represented using a binary number system. The binary number system is one in which values may take on one of two states, typically represented by a "1" and a "0". Various types of memory systems have been developed which include small programmable devices that store a single bit as either a "0" or a "1". For example, a transistor may be used as a switch which is either in an ON state or an OFF state. The ON state may be used to represent a "1" while the OFF state may be used to represent a "0".

One type of memory architecture being developed is crossbar memory architecture. Crossbar architecture includes two sets of interconnecting wire segments. A programmable device may be placed at each crosspoint between each wire segment. In one example, crossbar architecture may employ memristors as programmable devices. A memristor is a resistor which is able to change the value of its resistance in response to various programming conditions. A memristor may represent a "1" while in a low resistance state and a "0" while in a high resistance state.

When memristive devices are placed in crossbar architecture, it may be desirable to limit the number of memristive devices in a low resistive state along a particular wire segment of the crossbar architecture. Having too many devices in a low resistive state along a particular wire segment may allow too much electric current to pass through. Too much electric current passing through the wire segments may potentially interfere with read/write operations.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIGS. 7A-7C are diagrams showing illustrative bit placement before and after a cyclical shift of a set of bits along a particular path, according to one embodiment of principles described herein.

Throughout the drawings, identical reference numbers designate similar, but not necessarily identical, elements.

DETAILED DESCRIPTION

Figure 1:
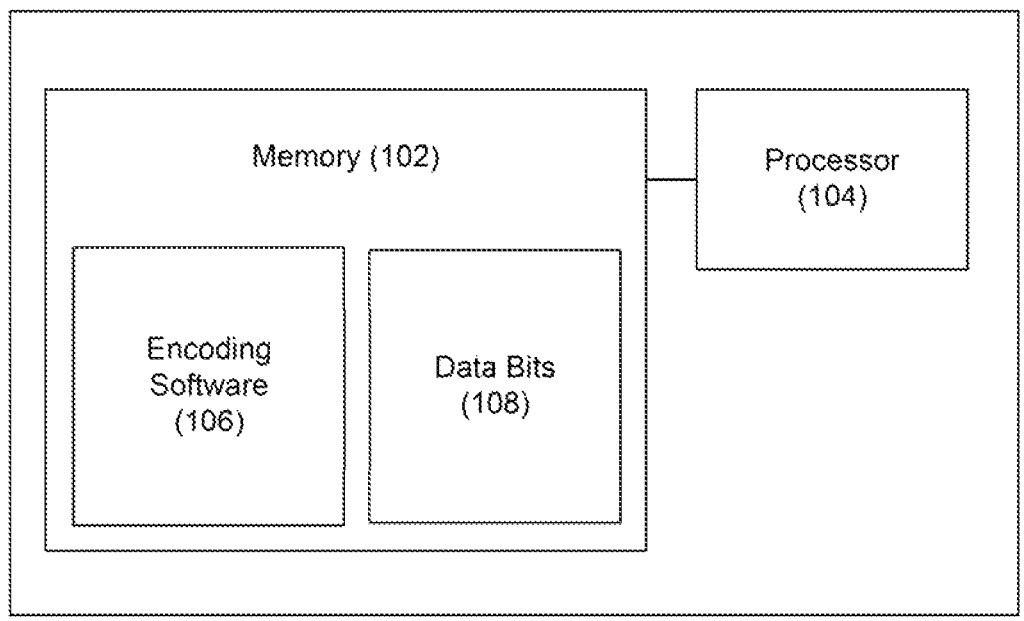
FIG. 1 is a diagram showing an illustrative physical computing system which may be used to encode data bits for crossbar memory architecture, according to one embodiment of principles described herein.

As mentioned above, it may be beneficial for the number of memristive devices in a low resistance state along a wire segment of a crossbar array to be subject to a constraint. In general, it is better that less than half of the programmable devices along crosspoints of a wire segment are in a low resistive state. Having more than half of the crosspoints in a low resistive state may allow too much electric current to pass through the wire segments. Too much electric current flowing through the wire segments may add extra noise that will interfere with the data signals used for read/write operations.

In light of this and other issues, the present specification relates to a method of encoding data bits so that when the data bits are scanned into and stored in a memory having crossbar architecture, the number of crosspoints being in a low resistive state may be limited for each wire segment within the crossbar array.

According to certain illustrative embodiments, a number of subsets of the total number of crosspoints within a crossbar matrix may be designated as included crosspoints. Included crosspoints are ones in which data bits may be stored. Each subset of crosspoints may correspond to a predetermined path through the crossbar matrix. The data bits may then be encoded so that when placed along the predetermined path associated with each subset, the number of bits representing a low resistive state is subject to a constraint. The constraint may be that no more than half of the crosspoints per wire segment may be in a low resistive state.

An encoding method or system embodying principles described herein may allow data bits to be encoded so that they may be scanned and stored on crossbar memory architecture without adversely affecting the optimal operating conditions of the memory architecture.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the term "disjointed intersecting of wire segments" is to be broadly interpreted as a crossbar array in which the end crosspoints of two parallel wire segments do not intersect the same'vertical wire segments.

Throughout this specification and in the appended claims, a "run length limited process" is to be broadly interpreted as an encoding scheme for a set of data bits, the scheme including two parameters (d, k). The parameter d indicates the minimum number of zeros to be placed between two ones and the parameter k indicates the maximum number of zeros which may be placed between two ones.

Referring now to the figures, FIG. 1 is a diagram showing an illustrative physical computing system (100). According to certain illustrative embodiments, a physical computing system (100) may be used to encode the bits which are to be stored in a crossbar memory structure. A physical computing system (100) may include a processor (104), a memory (102) having encoding and decoding software (106) and data bits (108) stored thereon.

The physical computing system (100) may be embodied as several different types of computing devices including, but not limited to, a server, laptop computer, a desktop computer, or a Personal Digital Assistant (PDA), or a general processing device. In some embodiments, the physical computing system may be a piece of hardware designed specifically for encoding or decoding bits. According to a number of frameworks, the system may be distributed geographically. For example, the user interface may be running on a client computer with the memory and processor running on a server computer. The physical computing system (100) may include a form of memory (102) including, but not limited to, a magnetic disk drive, a solid state drive, and/or an optical disc drive.

The encoding software (106) stored by the memory (102) may be embodied as computer readable code configured to cause a processor (104) to execute various instructions related to encoding data bits (108) to be stored on a crossbar memory structure.

Figure 2:
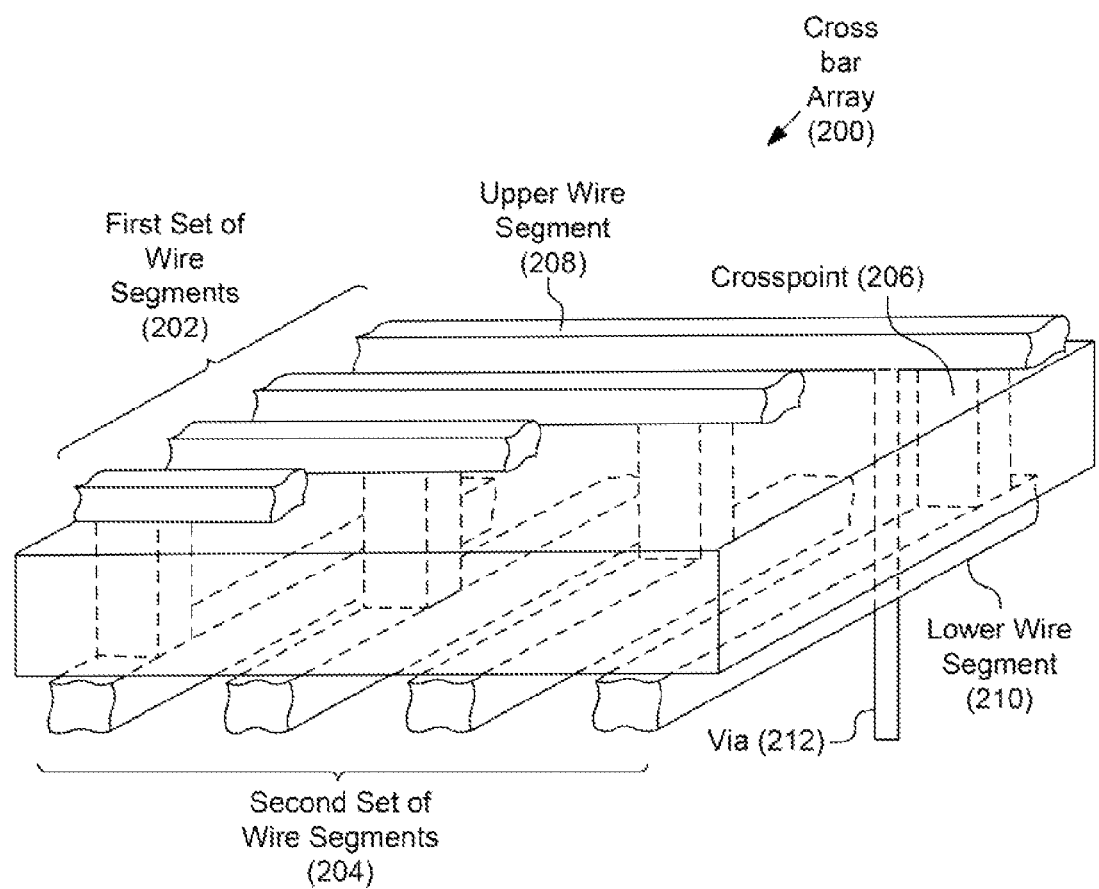
FIG. 2 is a diagram showing illustrative crossbar memory architecture, according to one embodiment of principles described herein.

FIG. 2 is a diagram showing illustrative crossbar memory architecture. According to certain illustrative embodiments, the crossbar architecture (200) may include an upper set of wire segments (202) which may generally be in parallel. Additionally, a second set of wire segments (204) may be generally perpendicular to and intersect the first set of wire segments (202). Programmable crosspoint devices (206) may be formed at the intersection between an upper wire segment (208) and a lower wire segment (210).

According to certain illustrative embodiments, the programmable crosspoint devices (206) may be memristive devices. Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. For example, by changing the dopant configurations within a memristive matrix, the electrical resistance of the device may be altered. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

Additionally or alternatively, the programmable crosspoint devices may be memcapacitive devices. According to one illustrative embodiment, memcapacitive devices share operational similarities with memristors, except the motion of dopants within the matrix primarily alters the capacitance of the device rather than its resistance.

According to certain illustrative embodiments, the crossbar architecture (200) may be used to form a non-volatile memory array. Non-volatile memory has the characteristic of not losing its contents when no power is being supplied. Each of the programmable crosspoint devices (206) may be used to represent one or more bits of data. Although individual crossbar lines (208, 210) in FIG. 2 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative embodiments, the crossbar architecture (200) may be integrated into a complimentary metal-oxide-semiconductor (CMOS) circuit or other conventional computer circuitry. Each individual wire segment may be connected to the CMOS circuitry through a via (212). The via (212) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 3:
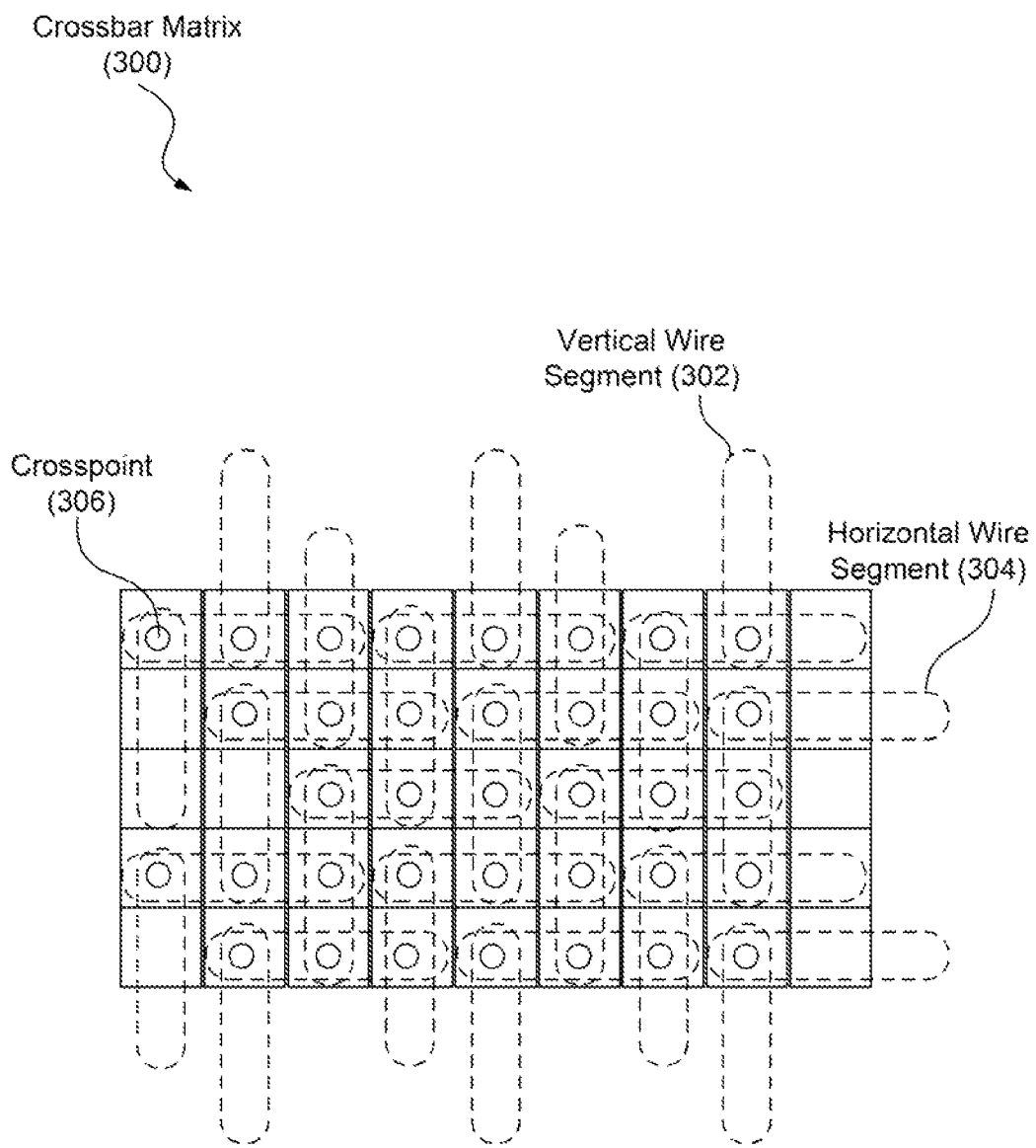
FIG. 3 is a diagram showing an illustrative crossbar matrix layout according to one embodiment of principles described herein.

FIG. 3 is a diagram showing an illustrative crossbar matrix (300). According to certain illustrative embodiments, a crossbar matrix may include a number of vertical wire segments (302), and a number of horizontal wire segments (304). Each wire segment (302, 304) may include three crosspoints (306). A number of the wire segments may be laid out in a disjoint manner as shown in FIG. 3. Although a typical crossbar array may include vias to connect to underlying read/write circuitry, the vias are not shown in FIG. 3 for the purpose of simplifying the illustration.

Each horizontal wire segment (304) may cross over three vertical wire segments (302). Thus, each wire segment (302, 304) will include three crosspoints (306). The disjoint layout may be achieved by shifting adjacent vertical wire segments as well as shifting adjacent horizontal wire segments (304). For example, a horizontal wire segment (304) may be placed one space to the right in relation to the horizontal wire segment (304) above it. Likewise, a vertical wire segment (302) may be placed one space down in relation to the vertical wire segment to its left. In some embodiments, the horizontal wire segments may be on an upper layer while the vertical wire segments may be on a lower layer. In such an embodiment, a top view would allow the horizontal wire segments to be seen fully and the vertical wire segments may be seen in part.

Figure 4A:
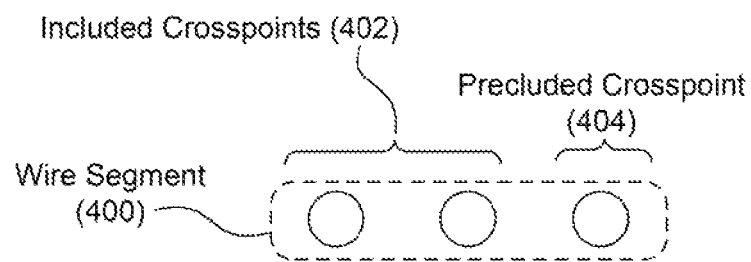
FIG. 4A is a diagram showing illustrative crosspoints of a wire segment of a crossbar matrix, according to one embodiment of principles described herein.

FIG. 4A is a diagram showing illustrative crosspoints of a wire segment of a crossbar matrix. According to certain illustrative embodiments, a given wire segment (400) may have a number of included crosspoints (402) and a number of precluded crosspoints (404). The included crosspoints may be used to store data bits while the precluded crosspoints may be set to a high resistive state representing a "0".

As mentioned above, the number of crosspoints in a low resistive state along a wire segment may be subject to a constraint. This constraint may allow for optimum operating conditions. For example, a constraint may be to have no more than half of the crosspoints along a given wire segment in a low resistive state. In the case of a crossbar matrix having wire segments with three crosspoints, no more than one crosspoint may be in a low resistive state per wire segment. Thus, only one bit per wire segment may be set to a "1".

The precluded crosspoint may be initially set to a high resistive state, thus representing a "0". The remaining included crosspoints (402) may be used to store data bits. However, the data bits stored along the included crosspoints should not both be set to a low resistive state. The data may be encoded and scanned in so as not to allow two values of "1" on a given wire segment.

Figure 4B:
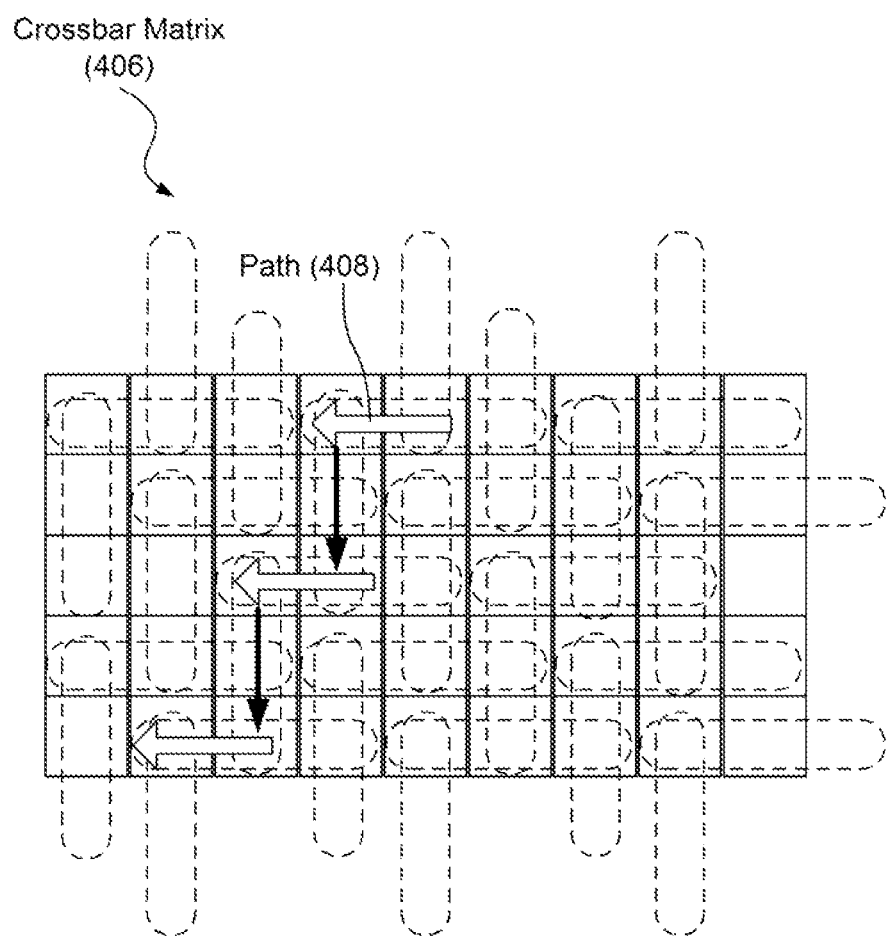
FIG. 4B is a diagram showing an illustrative path through a crossbar matrix, according to one embodiment of principles described herein.

FIG. 4B is a diagram showing, an illustrative path through a crossbar matrix (406). According to certain illustrative embodiments, the path in which data is to be scanned in may be designed so that a properly encoded stream of bits along each wire segment will be subject to the proper constraint. In the case of wire segments having three crosspoints each, the paths through the crossbar matrix and the encoding may ensure that only one crosspoint per wire segment is in a low resistive state.

In one embodiment, a scanning path may be determined by starting with the middle crosspoint of a horizontal wire segment in the first or second row of wire segments. The next position may be the leftmost crosspoint of the same wire segment. Next, the position may shift down two spaces and continue with the middle crosspoint of a different horizontal wire segment. This pattern may be repeated until reaching the end of the crossbar matrix. The crosspoints along a particular path may be defined as a subset of all crosspoints within the crossbar matrix. Multiple paths may be formed throughout the crossbar matrix using the pattern described above and illustrated in FIG. 4B.

Figure 5:
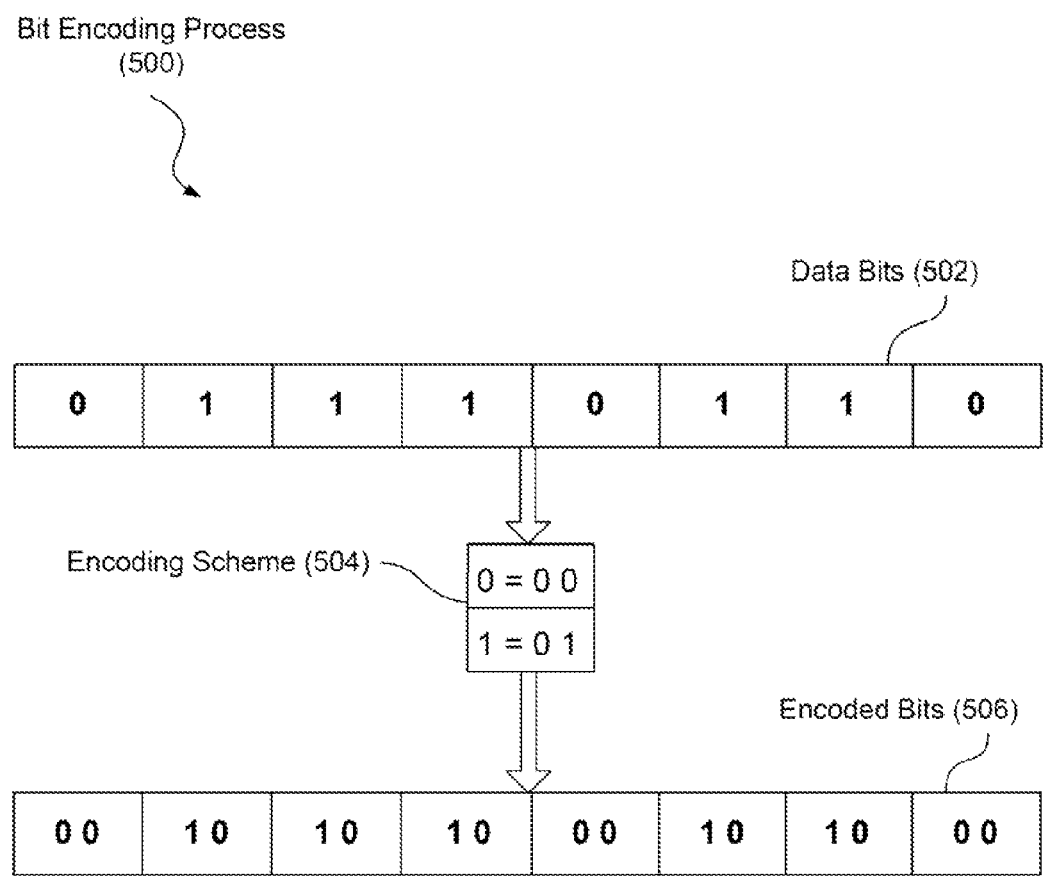
FIG. 5 is a diagram showing an illustrative bit encoding process, according to one embodiment of principles described herein.

FIG. 5 is a diagram showing an illustrative bit encoding process (500). According to certain illustrative embodiments, a set of data bits (502) may be put through an encoding scheme (504). The encoding scheme may be configured to produce a set of encoded bits (506) in which a "1" is never directly preceded or followed by another "1".

Data bits may represent a wide variety of information. For example, text, audio, video, and other file types are represented by vast numbers of bits. As will be appreciated by one skilled in the relevant art, there typically will be many cases in a string of binary data, that a "1" will be immediately preceded or followed by another "1".

Various encoding schemes may be used to encode the data bits in a manner such that in the resulting set of encoded bits, no "1" is immediately preceded or followed by another "1". In one example, each "0" may be replaced with a "00" and each "1" may be replaced with a "01". Thus, the resulting set of encoded bits (506) is such that no "1" is next to another "1" as shown in FIG. 5. Such an encoding scheme (504) is reversible. A reversible scheme is one that can be reversed and the original set of data bits (502) may be retrieved accurately from the set of encoded bits (506).

As will be appreciated by one skilled in the relevant art, there may be other encoding schemes which result in a set of bits in which no "1" is next to another "1". For example, in one encoding scheme, a "0" may be inserted after every "1". To decode such a scheme, a "0" may be removed after each "1". A further encoding scheme may be a Run Length Limited (RLL) scheme. RLL schemes generally comprise two parameters. For example, a (1, infinity) RLL scheme indicates that there is no upper limit on the number of zeros that may be placed between two ones, but that no "1" may neighbor another "1". Encoding schemes may be designed to reduce the number of bits which are placed into the final encoded bit structure while maintaining the desired functionality of being reversible and having no "1" neighbor another "1". A system or method embodying principles described herein may use any suitable encoding scheme which applies the proper constraints. In some embodiments, it may be useful to place constraints on the number of "1's" within any group of B consecutive bits along an encoded sequence, in which B is a prescribed group size.

Figure 6:
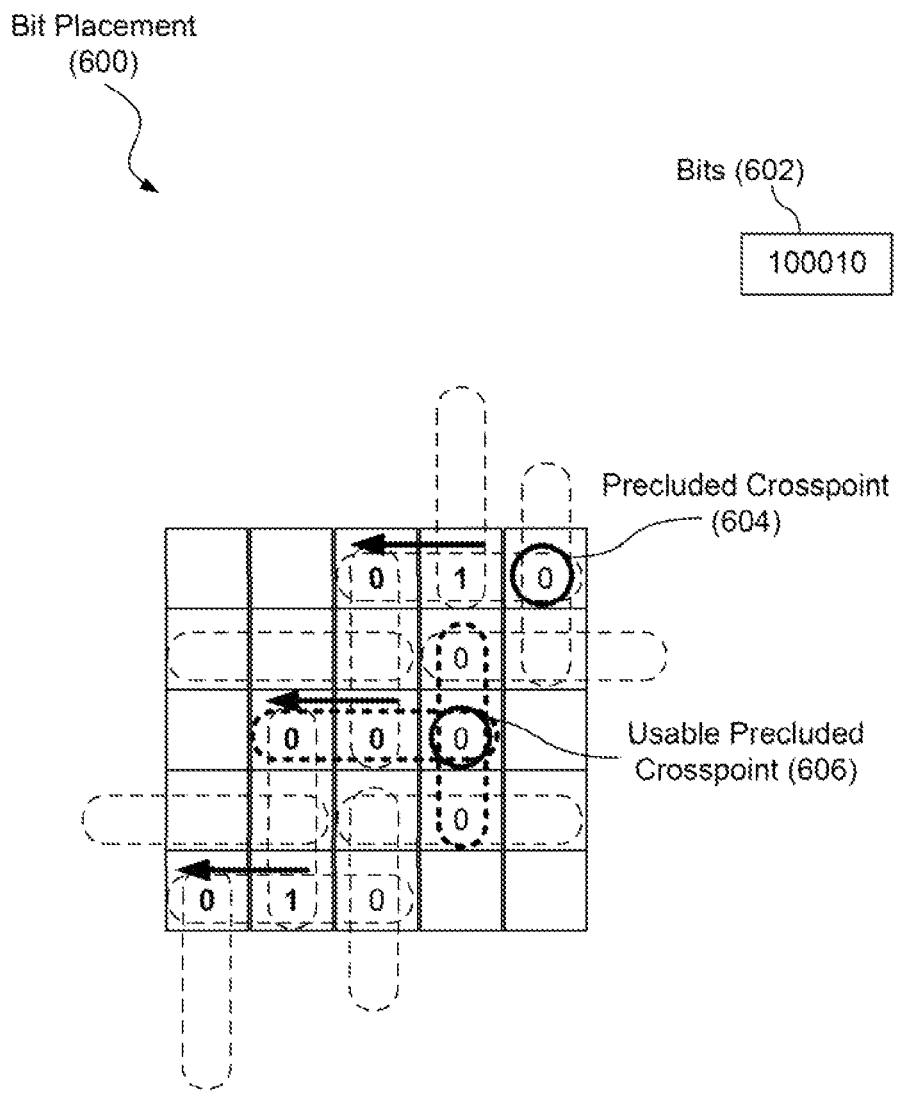
FIG. 6 is a diagram showing illustrative bit placement within a crossbar matrix, according to one embodiment of principles described herein.

FIG. 6 is a diagram showing illustrative bit placement (600) within a crossbar matrix. As mentioned above, suitably encoded data bits (602) may be scanned into a crossbar matrix along a subset of crosspoints corresponding to a predetermined path. The bits may be scanned along the path of initially included crosspoints as shown in FIG. 6.

The bits (602) may be scanned along the path illustrated in FIG. 4B. For example, the sequence of bits "100010" may be scanned in by starting with the first bit at the middle crosspoint of a wire segment in the top row. The next bit is placed on the leftmost crosspoint of the same wire segment. The next bit may then be placed on the middle crosspoint of a wire segment two spaces below the first wire segment as shown in FIG. 6. This pattern may continue until the edge of the crossbar matrix is reached.

In general, a crossbar matrix may be much larger than the crossbar matrices illustrated. As memory space becomes more valuable, especially in smaller electronic devices, it is desirable that each space able to store a bit be used. Precluding a bit from each wire segment and setting it to a zero may prevent the wire segment from violating a constraint, but doing so essentially wastes a crosspoint which may be used to store a data bit.

In some cases, a precluded crosspoint (604) may not need to be constrained. For example, if the other two crosspoints from both the vertical and horizontal wire segments of a given precluded crosspoint are storing a "0", then that initially precluded crosspoint may become a usable crosspoint (606). The encoding scheme used to encode the data bits may be designed so that more zeros are placed between any two ones. This may cause the encoded data bits to take up more space throughout the crossbar matrix. However, it may provide more opportunities for the precluded crosspoints to become usable. A function may be applied which will determine the proper coding scheme to maximize the efficiency of storing data bits in the crossbar matrix. For the example of FIG. 6, enumerative coding techniques known in the art may be used to reversibly encode data such that among all pairs of consecutive bits in the encoded sequence, roughly 60 percent may be '00', 20 percent may be '01', and 20 percent are '10'. This distribution may achieve a good tradeoff between the space taken up by the encoded bits (for a given amount of encoded data) and the number of usable precluded crosspoints.

FIGS. 7A-7C are diagrams showing illustrative bit placement before and after a cyclical shift of a set of bits along a particular path. According to certain illustrative embodiments, the bits along a particular predetermined path may be cyclically shifted to provide situations in which additional precluded crosspoints may be made usable. Such a process may maximize the number of initially precluded crosspoints which may be made usable, thus increasing the ratio of usable crosspoints to non-usable crosspoints.

FIG. 7A illustrates two adjacent paths (702, 704) through the crossbar matrix. Bit sequence 1 (706) is shown scanned in across path 1 (702) and bit sequence 2 (708) is shown scanned in across path 2 (704). Path 1 (702) is illustrated by the darkened arrows, while path 2 (704) is illustrated with the hollow arrows. A precluded crosspoint (710) exists in which the other two crosspoints from the horizontal wire segment are storing a "0". However, the bottom most crosspoint from the vertical wire segment associated with the precluded crosspoint (710) is storing a "1". Thus, the precluded crosspoint (710) is constrained and unusable.

FIG. 7B illustrates the bits along the two paths (702, 704) after bit sequence 2 (708) along path 2 (704) has been cyclically shifted. In one example of a cyclical shift, the bit in the leftmost crosspoint in each horizontal wire segment of the path (704) may be moved down to the middle crosspoint of the horizontal wire segment two spaces below. The bit in the middle crosspoint of each horizontal wire segment along the path (704) may be moved to the leftmost crosspoint. The bit in the leftmost crosspoint of the last horizontal wire segment of the path (704) may be moved back up to the middle crosspoint of the first wire segment of the path (704). The encoding process may make note of how many times each path is shifted so that the decoding process may reverse the shifting process properly.

After such a cyclical shift of path 2 (704), the initially precluded crosspoint (710) may become a usable crosspoint (712). The usable crosspoint (712) now has only zeros stored on both its associated horizontal wire segment and its associated vertical wire segment. Thus, the usable crosspoint (712) is no longer constrained and may be used as a data bit having a value of either "1" or "0".

FIG. 7C is a table (714) used to further illustrate a cyclical shift. The top row includes letters A-F representing six positions (716) along a path. The next row (718) indicates the position of bits that are placed along the path before a cyclical shift has occurred. The bottom row (720) indicates the position of bits placed along the path after the cyclical shift has occurred. As can be seen from FIG. 7C each bit is shifted once to the right. The last bit in position F is moved to the front and is now in position A.

Each path throughout the crossbar matrix may be cyclically shifted a number of times to maximize the number of precluded crosspoints which will become usable. Various functions may be developed which will find the optimum shift of the data bits along each path.

In some embodiments, the number of cyclic shifts taking place may be designed to bring the encoding scheme to a fixed rate scheme. A fixed rate scheme may refer to an encoding scheme that allows the number of usable precluded crosspoints in a crossbar matrix to be the same despite the data being encoded. A variable rate scheme is one in which the number of usable precluded crosspoints is dependent upon the data being encoded. For example, when data is scanned in and no cyclical shifts have taken place, there will be a certain number usable precluded crosspoints based on the data itself. Each set of data may present a different number of situations where a precluded crosspoint may become usable. Thus the encoding scheme may be considered a variable rate scheme. In some cases, it may be desirable to bring the variable rate encoding scheme to a fixed rate scheme. To do so, the cyclical shift may be performed only a certain number of times until the total number of usable precluded crosspoints reach a predetermined number. Thus, the total number of usable precluded crosspoints may be made equal across different sets of data.

After the encoding process is complete, the encoded bits may be scanned into their appropriate locations within a crossbar matrix. When the data is to be retrieved, the encoded bits may be read along their appropriate predetermined paths. After the bits have been read, they may then be decoded using the reverse process to which they were encoded.

The above illustrated embodiment is for the case that each wire segment includes three crosspoints. As will be appreciated by one skilled in the relevant art, crossbar arrays may be designed in which each wire segment includes four or more crosspoints. The above described encoding scheme may be adapted for the number of crosspoints per wire segment in a given array. For any number of crosspoints per wire segment, a certain number may be designated as precluded crosspoints. A path through the crossbar array may then be determined and an encoding scheme designed so that when bits are scanned along the path, the proper constraints are satisfied.

Figure 8:
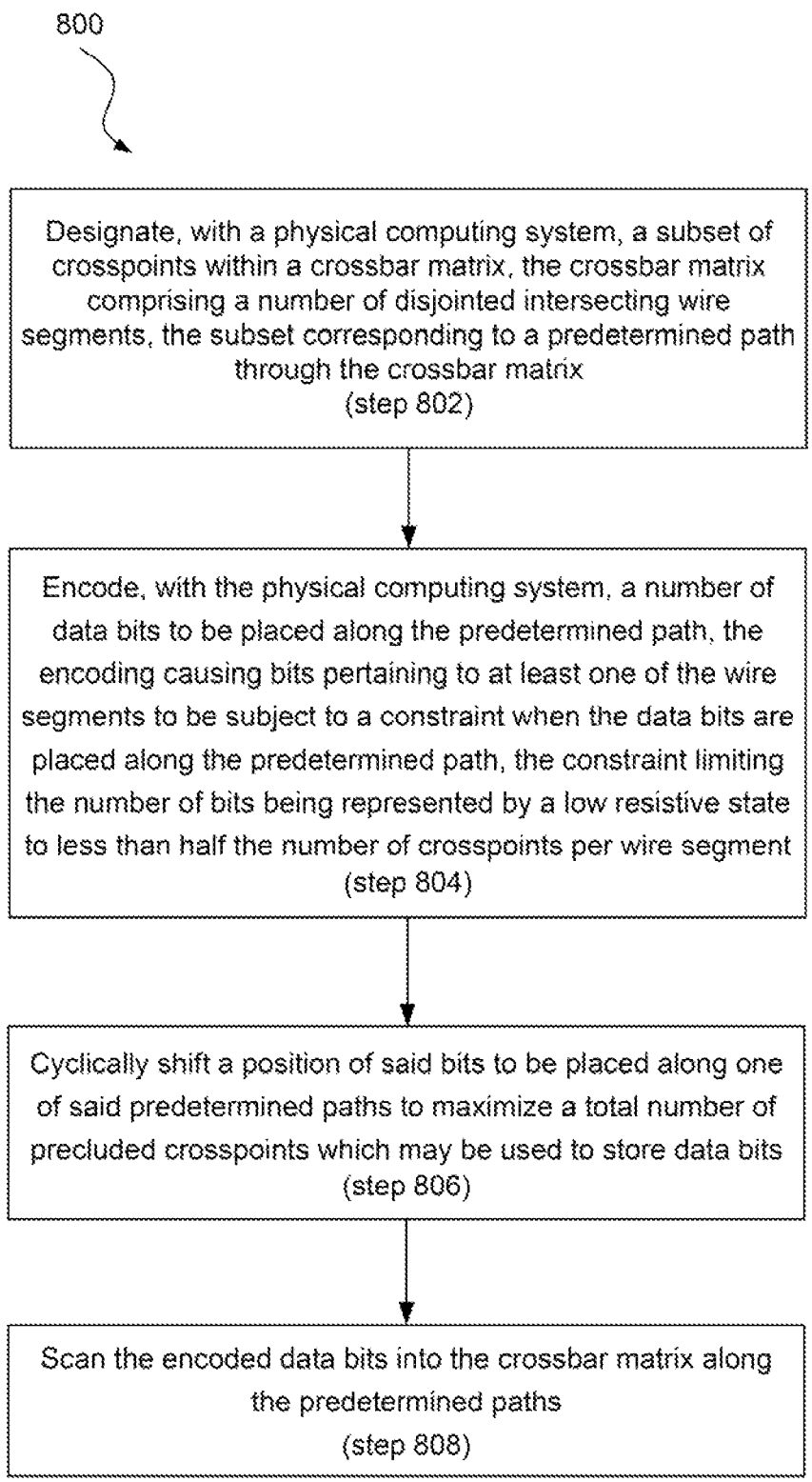
FIG. 8 is a flowchart showing an illustrative method for encoding bits to be stored in crossbar memory architecture, according to one embodiment of principles described herein.

FIG. 8 is a flowchart showing an illustrative method (800) for encoding bits to be stored in crossbar memory architecture. According to certain illustrative embodiments, the method may include designating (step 802), with a physical computing system, a subset of crosspoints within a crossbar matrix, the crossbar matrix comprising a number of disjointed intersecting wire segments, the subset corresponding to a predetermined path through the crossbar matrix; and encoding (step 804), with the physical computing system, a number of data bits to be placed along the predetermined path, the encoding causing bits pertaining to at least one of the wire segments to be subject to a constraint when the data bits are placed along the predetermined path, the constraint limiting the number of bits being represented by a low resistive state to less than half the number of crosspoints per wire segment. The method (800) may further include cyclically shifting (step 806) a position of said bits to be placed along one of said predetermined paths to maximize a total number of precluded crosspoints which may be used to store data bits; and scanning (step 808) the encoded data bits into the crossbar matrix along the predetermined path.

In sum, an encoding method or system embodying principles described herein may allow data bits to be encoded so that they may be scanned and stored on crossbar memory architecture without adversely affecting the optimal operating conditions of the memory architecture.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A method for encoding bits to be stored within a crossbar memory architecture performed by a physical computing system, the method comprising:

designating, with the physical computing system, a subset of crosspoints of wire segments of a crossbar matrix, the subset corresponding to a predetermined path through the crossbar matrix, wherein the wire segments comprise disjointed intersecting wire segments that form the crossbar matrix; and encoding, with the physical computing system, a number of data bits to be placed along the predetermined path, wherein the encoding of the number of data bits limits a number of bits per wire segment that are represented by a low resistive state based on a number of crosspoints in each corresponding wire segment, the encoding limits the number of bits per wire segment that are represented by a low resistive state based on the number of crosspoints per wire segment by limiting the number of bits per wire segment that are represented by a low resistive state to less than half the number of crosspoints per wire segment, the predetermined path includes a number of crosspoints of the wire segments of the crossbar matrix, and all paths through the crossbar matrix comprise a number of initially precluded crosspoints, each one of the wire segments of the crossbar matrix comprising one of the precluded crosspoints, the precluded crosspoints being placed in a high resistive state.

2. The method of claim 1, wherein one of the precluded crosspoints is used to store data bits if at most one less than half a number of crosspoints from both wire segments crossing at the precluded crosspoint are in a low resistive state.

3. The method of claim 1, wherein encoding the number of data bits is configured to maximize a total number of precluded crosspoints which may be used to store data bits.

4. The method of claim 1, further comprising cyclically shifting a position of the bits to be placed along one of the predetermined paths to maximize a total number of precluded crosspoints which may be used to store data bits.

5. The method of claim 1, wherein encoding the number of bits comprises using a run length limited process.

6. The method of claim 1, further comprising scanning the encoded data bits into the crossbar matrix along the predetermined path.

7. The method of claim 1, further comprising:
reading the encoded data bits along the predetermined path; and
decoding the data bits.

8. A computing system comprising:
a processor;
a memory communicatively coupled to the processor; and
a crossbar matrix comprising a number of disjointed intersecting wire segments, the crossbar matrix communicatively coupled to the processor;
wherein the processor is configured to:
designate a subset of crosspoints within a crossbar matrix, the subset corresponding to a predetermined path through the crossbar matrix; and
encode a number of data bits to be placed along the predetermined path based on a number of crosspoints of at least one of the wire when the data bits are placed along the predetermined path,
wherein the predetermined path includes a number of crosspoints from multiple wire segments of the crossbar matrix, all paths through the crossbar matrix leaving a number of initially precluded crosspoints, each wire segment of the crossbar matrix comprising one of the precluded crosspoints, the precluded crosspoints being placed in a high resistive state.

9. The system of claim 8, wherein the crosspoints comprise one of a memristive device and a memcapacitive device.

10. The system of claim 8, wherein to scan the encoded data bits into the crossbar matrix along the predetermined path, the processor is further configured to scan the encoded data bits into the crossbar matrix along the predetermined path by causing a programming condition to be applied to the crosspoints along the predetermined paths.

11. A method for encoding bits to be stored within a crossbar memory architecture performed by a physical computing system, the method comprising:
designating, with the physical computing system, a subset of crosspoints within a crossbar matrix, the crossbar matrix comprising a number of disjointed intersecting wire segments, each wire segment comprising three crosspoints, the subset corresponding to a predetermined path through the crossbar matrix, the predetermined path precluding one crosspoint per wire segment;
encoding, with the physical computing system, a number of data bits to be placed along the predetermined path, the encoding causing only one crosspoint per wire segment to be in a low resistive state when placed along the predetermined path; and
scanning the encoded data bits into the crossbar matrix along the predetermined paths.

* * * * *